(12) United States Patent
Kurata et al.

(10) Patent No.: US 8,999,281 B2
(45) Date of Patent: Apr. 7, 2015

(54) SCINTILLATOR SINGLE CRYSTAL, HEAT TREATMENT METHOD FOR PRODUCTION OF SCINTILLATOR SINGLE CRYSTAL, AND METHOD FOR PRODUCTION OF SCINTILLATOR SINGLE CRYSTAL

(75) Inventors: Yasushi Kurata, Hitachinaka (JP); Naoaki Shimura, Hitachinaka (JP); Tatsuya Usui, Hitachinaka (JP)

(73) Assignee: Hitachi Chemical Company, Ltd., Tokyo (JP)

(*) Notice: Subject to any disclaimer, the term of this patent is extended or adjusted under 35 U.S.C. 154(b) by 333 days.

(21) Appl. No.: 12/130,179

(22) Filed: May 30, 2008

(65) Prior Publication Data
US 2008/0299027 A1 Dec. 4, 2008

(30) Foreign Application Priority Data

Jun. 1, 2007 (JP) ................ P2007-146794
Jan. 10, 2008 (JP) ................ P2008-003581

(51) Int. Cl.
| | | |
|---|---|---|
| C01F 17/00 | (2006.01) | |
| C30B 29/22 | (2006.01) | |
| C30B 15/00 | (2006.01) | |
| C30B 33/02 | (2006.01) | |
| C09K 11/77 | (2006.01) | |

(52) U.S. Cl.
CPC .......... C30B 29/22 (2013.01); C01F 17/00 (2013.01); C30B 15/00 (2013.01); C30B 33/02 (2013.01); C09K 11/7774 (2013.01)

(58) Field of Classification Search
CPC .................................................. C01F 17/00
USPC .............. 252/301.4 F; 423/263; 250/370.11; 117/3–19
See application file for complete search history.

(56) References Cited

U.S. PATENT DOCUMENTS

| | | | |
|---|---|---|---|
| 4,958,080 A | 9/1990 | Melcher | |
| 5,264,154 A | 11/1993 | Akiyama et al. | |
| 6,278,832 B1 | 8/2001 | Zagumennyi et al. | |
| 6,624,420 B1 | 9/2003 | Chai et al. | |
| 6,921,901 B1 | 7/2005 | Chai et al. | |
| 7,297,954 B2 * | 11/2007 | Kurashige et al. | 250/361 R |
| 2006/0266276 A1 * | 11/2006 | Shimura et al. | 117/19 |
| 2006/0266945 A1 * | 11/2006 | Kurashige et al. | 250/361 R |
| 2006/0288926 A1 * | 12/2006 | Kurata et al. | 117/16 |

FOREIGN PATENT DOCUMENTS

| | | | |
|---|---|---|---|
| JP | 01-203492 A | 8/1989 | |
| JP | 7-78215 A | 3/1995 | |
| JP | 2852944 B2 | 11/1998 | |
| JP | 2001-524163 A | 11/2001 | |
| JP | 2004059382 A * | 2/2004 | ............ C30B 29/22 |
| JP | 3668755 B2 | 4/2005 | |
| JP | 2005-350608 A | 12/2005 | |
| JP | 2006-199727 A | 8/2006 | |
| JP | 2006-257199 A | 9/2006 | |
| JP | 2007-1850 A | 1/2007 | |
| JP | 2007-2226 A | 1/2007 | |
| JP | 2007-16197 A | 1/2007 | |
| WO | 2006-018586 A1 | 2/2006 | |

OTHER PUBLICATIONS

C.L. Melcher et al., "Scintillation Properties of LSO: Ce Boules", IEEE Transactions on Nuclear Science, Jun. 2000, pp. 965-968.
"Elements, Atomic Weight and Abundance in Space and Earth Crust", The website of the Earth Resources Research (http://home.hiroshima-u.ac.jp/er/Min_G2.html), Hiroshima University.
Japanese Office Action dated Oct. 9, 2012, issued in corresponding Japanese Paten Application No. 2008-003581 (2 pages).
Szupryczynski, Piotr et al. "Thermoluminescence and Scintillation Properties of Rare Earth Oxyorthosilicate Scintillators", IEEE Transactions on Nuclear Science, vol. 51, No. 3, Jun. 2004, pp. 1103-1110 (Cited in Japanese Office Action dated Oct. 9, 2012).

* cited by examiner

Primary Examiner — Brian Walck
(74) Attorney, Agent, or Firm — Westerman, Hattori, Daniels & Adrian, LLP

(57) ABSTRACT

The scintillator single crystal of the invention comprises a cerium-activated orthosilicate compound represented by the following general formula (1). The scintillator single crystal of the invention exhibits improved scintillation properties by reduced segregation between elements in the crystal ingot.

$$Lm_{2-(x+y+z)}Ln_xLu_yCe_zSiO_5 \quad (1)$$

(Wherein Lm represents at least one element selected from among Sc and Y and lanthanoid elements with lower atomic numbers than Lu, Ln represents at least one element selected from among Sc, Y, B, Al, Ga and In and lanthanoid elements with ion radii intermediate between Lm and Lu, x represents a value of greater than zero and no greater than 0.5, y represents a value of greater than 1 and less than 2, and z represents a value of greater than zero and no greater than 0.1.).

9 Claims, No Drawings

SCINTILLATOR SINGLE CRYSTAL, HEAT TREATMENT METHOD FOR PRODUCTION OF SCINTILLATOR SINGLE CRYSTAL, AND METHOD FOR PRODUCTION OF SCINTILLATOR SINGLE CRYSTAL

BACKGROUND OF THE INVENTION

1. Field of the Invention

The present invention relates to a scintillator single crystal used in a single-crystal scintillation detector (scintillator) for gamma ray or other radiation in the fields of radiology, physics, physiology, chemistry, mineralogy and oil exploration, such as for medical diagnostic positron CT (PET), cosmic radiation observation, underground resource exploration and the like, as well as to a heat treatment method for production of the scintillator single crystal and to a method for production of the scintillator single crystal, and more specifically, the invention relates to a scintillator single crystal containing a cerium-activated orthosilicate compound, to a heat treatment method for production of the scintillator single crystal and to a method for production of the scintillator single crystal.

2. Related Background Art

Scintillators composed of cerium-activated gadolinium orthosilicate compounds have short scintillation decay times and large radiation absorption coefficients, and are therefore employed as radiation detectors for positron CT and the like. However, while the light output of such a scintillator is larger than that of a BGO scintillator, but is only about 20% of the light output of a NaI (Tl) scintillator and is therefore in need of further improvement.

Scintillators employing single crystals of cerium-activated lutetium orthosilicates represented by the general formula $Lu_{2(1-x)}Ce_{2x}SiO_5$ (see Japanese Patent Publication No. 2852944 and U.S. Pat. No. 4,958,080), scintillators employing single crystals of compounds represented by the general formula $Gd_{2-(x+y)}Ln_xCe_ySiO_5$ (where Ln is at least one element selected from the group consisting of Sc, Tb, Dy, Ho, Er, Tm, Yb and Lu) (see Japanese Examined Patent Publication HEI No. 7-78215 and U.S. Pat. No. 5,264,154), and scintillators employing single crystals of cerium-activated lutetium yttrium orthosilicate represented by the general formula $Ce_{2x}(Lu_{1-y}Y_y)_{2(1-x)}SiO_5$ (see U.S. Pat. No. 6,624,420 and U.S. Pat. No. 6,921,901) have become known in recent years. Not only are such scintillators known to have improved crystal density, but cerium-activated orthosilicate compound-containing single crystals are known to have higher light outputs and shorter scintillation decay times.

In addition, Japanese Patent Publication No. 3668755 and U.S. Pat. No. 6,278,832 describe scintillation materials based on silicate crystals comprising lutetium (Lu) and cerium (Ce), including an oxygen vacancy a and having a chemical composition represented by the general formula: $Lu_{1-y}Me_yA_{1-x}Ce_xSiO_{5-z}\alpha_z$, where:

$x = 1 \times 10^{-4} \sim 0.2$
$y = 1 \times 10^{-5} \sim 0.05$ [wherein A is at least one element selected from the group consisting of Lu and Gd, Sc, Y, La, Pr, Nd, Sm, Eu, Tb, Dy, Ho, Er, Tm and Yb, and Me is at least one element selected from the group consisting of H, Li, Be, B, C, N, Na, Mg, Al, P, S, Cl, K, Ca, Ti, V, Cr, Mn, Fe, Co, Ni, Cu, Zn, Ga, Ge, As, Se, Rb, Sr, Zr, Nb, Mo, Ru, Rh, Pd, Ag, Cd, In, Sn, Sb, Cs, Ba, Hf, Ta, W, Re, Os, Ir, Pt, Au, Hg, Tl, Pb, Bi, U and Th]. Japanese Patent Publication No. 3668755 and U.S. Pat. No. 6,278,832 mention over 50 elements from H to Th as the element Me instead of Lu, and such elements are described as having effects of rendering the crystals resistant to cracking during the cutting and production of scintillation elements, as well as effects of bringing out the waveguide properties in waveguide elements.

It is further mentioned that including ions with oxidation numbers of +4, +5 and +6 (for example, Zr, Sn, Hf, As, V, Nb, Sb, Ta, Mo, W or Th) in the original reagents, or adding the necessary amounts to the scintillation material, inhibits generation of $Ce^{4+}$ ion due to charge compensation, thus not only improving the scintillation property of the crystal but also reducing cracking and preventing formation of vacancies in the oxygen sublattice. Thus, when an ion with an oxidation number of +4, +5 or +6 (for example, Zr, Sn, Hf, As, V, Nb, Sb, Ta, Mo, W or Th) is present in the original reagent, or a necessary amount thereof is added to the scintillation material, a satisfactory scintillation property is obtained as a result, even when using a cheaper starting material of low purity containing any of the aforementioned 50 or more elements as impurities.

Japanese Unexamined Patent Publication No. 2006-199727 describes a Ce and Tm co-activated lutetium silicate single crystal as a cerium-activated lanthanoid silicate scintillator single crystal represented by the general formula $Ce_{2x}Ln_{2y}Lu_{2(1-x-y)}SiO_5$ (where Ln is any element from among lanthanoid elements except for Lu, and $2 \times 10^{-4} \le x \le 3 \times 10^{-2}$, $1 \times 10^{-4} \le y \le 1 \times 10^{-3}$), and it is stated that coactivation with Tm improves variation in light output, decay time and energy resolution.

Also, Japanese Unexamined Patent Publication No. 2005-350608 discloses a Ce and Ti co-activated gadolinium silicate single crystal as a rare earth silicate scintillator single crystal, wherein the parent material is a rare earth silicate crystal, the rare earth element is selected from the group consisting of Sc, Y, La, Gd and Lu, and Ti and Ce are included as luminescent center elements preferably with a Ti/Ce molar ratio of 1/10,000-1/10, and it is stated that coactivation with Ti improves the light output and speeds the decay time.

In Japanese Unexamined Patent Publication No. 2007-2226 there is described a Ce-activated gadolinium lutetium silicate (Lu composition: 20%) single crystal with an emission intensity spectrum with a maximum peak wavelength in the range of 450 nm-600 nm, as a scintillator single crystal having a chemical composition represented by the general formula: $Ce_xLn_ySi_zO_u$ (where Ln represents at least two different elements selected from among Y, Gd and Lu, and $0.001 \le x \le 0.1$, $1.9 \le y \le 2.1$, $0.9 \le z \le 1.1$, $4.9 \le u \le 5.1$).

Finally, Japanese Unexamined Patent Publication No. 2006-257199 describes a Ce-activated gadolinium lutetium silicate (Lu composition: 20%) single crystal characterized by having an emission intensity peak wavelength of longer than 450 nm and a half-width of greater than 112 nm, upon excitation with any wavelength 360 nm-400 nm, as a rare earth silicate scintillation material represented by the general formula: $Ln_{2x}Gd_{2(1-x-y)}Ce_{2y}SiO_5$ (where Ln represents at least one element selected from among Sc, Y and Lu, and $0.1 \le x \le 0.5$, $0.01 \le y \le 0.1$).

SUMMARY OF THE INVENTION

As explained above, single crystals can significantly differ in their properties even if the elements used as starting materials appear to be similar in nature. For example, with the rare earth silicate single crystal represented by the general formula: $Lu_{1-y}Me_yA_{1-x}Ce_xSiO_{5-z}\alpha_z$ which is described in Japanese Patent Publication No. 3668755 and U.S. Pat. No. 6,278,832, it has been discovered that the crystal may undergo coloration and the light output may be impaired if an element with an oxidation number of +4, +5 or +6 (for example, Zr, Sn, Hf, As, V, Nb, Sb, Ta, Mo, W or Th) is selected as the element represented by A, and its ion is present in the original reagent or added to the scintillation material.

Also, while Japanese Patent Publication No. 3668755 and U.S. Pat. No. 6,278,832 mention over 50 elements that have effects of rendering the crystals resistant to cracking during the cutting and production of scintillation elements, as well as effects of bringing out the waveguide properties in waveguide elements, it was found that they often do not improve the light output or reduce the effects of oxygen deficiency.

For example, investigation by the present inventors has revealed that in silicate single crystals containing Lu and Ce represented by the chemical formulas in Japanese Patent Publication No. 3668755 and U.S. Pat. No. 6,278,832, oxygen deficiency (corresponding to oxygen lattice defects) occurs more readily with Lu-containing orthosilicate compound single crystals, and that orthosilicate compound single crystals wherein other rare earth element is selected from the group consisting of Dy, Ho, Er, Tm, Yb, Lu, Y and Sc which have smaller ion radii than Tb tend to produce a C2/c crystal structure and thus have a greater tendency to oxygen deficiency (corresponding to oxygen lattice defects). Also, the elements of Group 2 (IIa) of the Periodic Table mentioned in Japanese Patent Publication No. 3668755 and U.S. Pat. No. 6,278,832 as detrimental elements that produce a Ce valency of 4 are, conversely, more effective at preventing oxygen defects, with Mg and Ca being particularly effective from the viewpoint of ion radius. In addition, since these elements can inhibit change in Ce ion valency even in atmospheres that contain trace amounts of oxygen, adjusting the atmosphere for heat treatment either during or after growth can further reduce oxygen deficiency, and this is also taught in Japanese Unexamined Patent Publication No. 2007-16197. Thus, the basic composition and added materials for a single crystal must be changed depending on the purpose and desired effect, although limits exist on the types of elements composing them.

Incidentally, cerium-activated lutetium orthosilicate single crystals represented by the general formula: $Lu_{2(1-x)}Ce_{2x}SiO_5$ tend to have variation in scintillation properties in the same crystal ingot and between ingots, due to defects and impurities in the starting material that result from exposure to a low-oxygen atmosphere during crystal growth.

On the other hand, with cerium-activated orthosilicate compound single crystals represented by the general formula: $Lm_{2-(x+y)}Lu_xCe_ySiO_5$ (where Lm is at least one element selected from among Sc, Y and lanthanoid elements other than Lu), the same problems are faced as with single crystals having the structure of $Lu_{2(1-x)}Ce_{2x}SiO_5$, while void-like crystal defects are also generated in the latter stage of crystal growth, when crystal growth is accomplished by a method of pulling from a melt by the Czochralski method, thus producing opaqueness in the crystals or variation in crystal size when automatic diameter control is employed. In some cases the melt separates, making it difficult to accomplish continuous crystal growth. Opaqueness of the crystal can notably reduce differences in the scintillation property and create numerous cracks. Even if the clarity is not lowered to an apparent extent, the differences in scintillation property may be relatively large (more variation in scintillation property) depending on the vertical position of the crystal ingot.

It has been found that these problems that are observed with cerium-activated orthosilicate compound single crystals represented by the general formula: $Lm_{2-(x+y)}Lu_xCe_ySiO_5$ (where Lm is at least one element selected from among Sc, Y and lanthanoid elements other than Lu) occur because the single crystal is a mixed crystal of $Lu_2SiO_5$ and $Lm_2SiO_5$. Specifically, they were found to be attributable to a segregation phenomenon whereby the crystal composition in the crystal ingot differs during single crystal growth due to the different ion radii of Lu and Lm.

The opaqueness of the crystal that occurs in the latter stage of crystal growth is believed to be due to void-like defects generated by cell growth occurring concomitantly with the segregation phenomenon. Presumably, since opaqueness of the crystal and the resulting reduction in light transmittance impairs the heat dissipation of the crystal, the form of the solid-liquid interface varies, making it difficult to achieve automatic diameter control of the crystal and resulting in separation of the melt. Generally, growth of single crystals containing cerium-activated orthosilicate compounds is accomplished by the Czochralski method with RF (Radio Frequency) induction heating using an Ir crucible because of the high melting point of the single crystal, but methods of crystal growth from melts using seed crystals, such as the Czochralski method, tend to result in inconveniences arising from effects of segregation due to the differences in ion radii.

Also, in the case of cerium-activated orthosilicate compound single crystals represented by the general formula: $Lm_{2-(x+y)}Lu_xCe_ySiO_5$ (where Lm is at least one element selected from among Sc, Y and lanthanoid elements other than Lu), the light output is usually higher with a higher compositional ratio of Lu. Therefore when the Lu concentration differs vertically in the ingot, the single crystal sections cut from the ingot will also exhibit different light outputs depending on where they are cut out from the ingot. Even when opaqueness of the crystal is not discernible, the light output may be reduced and the energy resolution may be worse at the lower end of the ingot as a result of fine defects inside the crystal.

In the case of a $Gd_{2(1-x)}Ce_{2x}SiO_5$ (cerium-activated gadolinium orthosilicate: GSO) single crystal, the only rare earth elements capable of trivalent states are Gd and the activator Ce, and because of the similar ion radii of Gd and Ce, the distribution coefficient of Ce in the gadolinium orthosilicate is approximately 0.7. The distribution coefficient is the value yielded by $Cs=KoCo(1-g)^{(Ko-1)}$ (where Ko is the distribution coefficient, Cs is the concentration in the crystal, Co is the concentration in the melt and g is the solidification ratio). Although the light output at the upper end of the crystal will tend to be slightly higher than the lower end of the crystal, the change in concentration of Gd and Ce in the crystal ingot is relatively small, and therefore the difference in properties does not pose a major problem. However, since the Ce concentration dependency of the scintillation decay time is significant, the scintillation decay time at the upper end of the crystal ingot tends to be longer than at the lower end of the ingot.

On the other hand, in the case of a $Lu_{2(1-x)}Ce_{2x}SiO_5$ (cerium-activated lutetium orthosilicate: LSO) single crystal, the only rare earth elements capable of a trivalent state are Lu and the activator Ce, and since the ion radius of Ce is larger than the ion radius of Lu, the difference in ion radii is relatively large, unlike in GSO. Consequently, the distribution coefficient of Ce in the lutetium orthosilicate crystal is about 0.2 and the change in concentration of Lu and Ce in the crystal ingot is relatively large. Nevertheless, the scintillation properties of the $Lu_{2(1-x)}Ce_{2x}SiO_5$ (cerium-activated lutetium orthosilicate) single crystal including light output and scintillation decay time have low Ce concentration dependency compared to a cerium-activated gadolinium orthosilicate single crystal (GSO), and therefore the difference in scintillation properties of the crystal ingot does not constitute much of problem. On the other hand, the variation in properties in the crystal ingot due to oxygen defects or inclusion of other impurities occurs more readily than with a cerium-activated gadolinium orthosilicate single crystal (GSO), and the light output at the lower end of the crystal is notably reduced compared to the upper end of the crystal. This phenomenon is mentioned in C. L. Melcher et al., IEEE Transactions on Nuclear Science, Vol. 47, No. 3, June 2000, p 965-968, and it is taught in U.S. Pat. No. 6,624,420 and U.S. Pat. No. 6,921,901 that the same tendency is found in cerium-activated lutetium yttrium orthosilicate single crystals represented by the general formula: $Ce_{2x}(Lu_{1-y}Y_y)_{2(1-x)}SiO_5$, and that improvement over cerium-activated lutetium orthosilicate single crystals is achieved with a composition where $y \geq 0.3$.

As mentioned above, the problems with cerium-activated orthosilicate compound single crystals represented by the general formula: $Lm_{2-(x+y)}Lu_xCe_ySiO_5$ (where Lm is at least one element selected from the group consisting of Sc, Y and lanthanoid elements other than Lu) include the problem of crystal opaqueness due to void-like crystal defects, the problem of difficulty in achieving stabilized crystal growth, and the problem of variation in scintillation properties within the crystal ingot.

It is an object of the present invention to solve these problems associated with conventional scintillator single crystals. More specifically, it is an object to provide a scintillator single crystal with improved scintillation properties by reducing the segregation phenomenon between elements in the single crystal. It is another object of the invention to provide a heat treatment method for production of a scintillator single crystal with improved scintillation properties by reducing the segregation phenomenon between elements in the single crystal, as well as a method for production of the scintillator single crystal.

The present inventors have discovered that the aforementioned problems of cerium-activated orthosilicate compound single crystals are attributable to cell growth that occurs as a result of the segregation phenomenon in the latter stage of single crystal growth due to the differences in the ion radii of Lm and Lu, and to differences in the crystal composition of the single crystal (single crystal ingot), and that the problems are more prominent as the difference in the ion radii of Lm and Lu increases and especially when the ion radius of Lm is larger than that of Lu. Moreover, it was found that the segregation phenomenon is more marked with a larger crucible diameter for single crystal growth by the Czochralski method that results in a larger crystal size, with a smaller temperature gradient in the starting melt, with a larger crystal pulling speed and with a higher rotational speed of the crystal during crystal growth.

The present invention has been accomplished on the basis of this acquired knowledge, and on the finding that the aforementioned segregation phenomenon can be reduced by including an element having an ion radius intermediate between that of Lm and Lu in the single crystal structure.

Specifically, the invention is a scintillator single crystal comprising a cerium-activated orthosilicate compound represented by the following general formula (1).

$$Lm_{2-(x+y+z)}Ln_xLu_yCe_zSiO_5 \tag{1}$$

(Wherein Lm represents at least one element selected from among Sc and Y and lanthanoid elements with lower atomic numbers than Lu, Ln represents at least one element selected from among Sc, Y, B, Al, Ga and In and lanthanoid elements with ion radii intermediate between Lm and Lu, x represents a value of greater than zero and no greater than 0.5, y represents a value of greater than 1 and less than 2, and z represents a value of greater than zero and no greater than 0.1.)

The scintillator single crystal provided by the invention exhibits an effect of minimizing segregation of Lm (variation in the compositional ratio of Lm and Lu) while also minimizing segregation of Ce, and has reduced variation in the scintillation properties in the single crystal and thus improved scintillation properties. Specifically, it is a single crystal exhibiting stabilized crystal growth with minimal generation of crystal defects, and thus reduced crystal opaqueness and cracking and reduced abnormal growth (shape anomalies).

In the scintillator single crystal of the invention, preferably Lm is Gd and Ln is at least one element selected from among Sc, Y, Yb, Tm, Er, Ho, Dy, Tb, B, Al, Ga and In. The scintillator single crystal can reduce not only generation of defects due to segregation of Gd and abnormal growth during the latter stage of crystal growth, but also differences in the scintillation property in the vertical direction of the crystal ingot.

In the scintillator single crystal described above, Ln is preferably Y. Such a scintillator single crystal can further reduce not only generation of defects due to segregation of Gd and abnormal growth during the latter stage of crystal growth, but also differences in the scintillation property in the vertical direction of the crystal ingot, while also further improving the scintillation property of the single crystal.

In the scintillator single crystal described above, preferably x is a value greater than zero and no greater than 0.2, and a value smaller than $[2-(x+y+z)]$, y is a value greater than 1.6 and less than 2, and z is a value greater than 0.001 and no greater than 0.02. Such a scintillator single crystal can further reduce not only generation of defects due to segregation of Gd and abnormal growth during the latter stage of crystal growth, but also differences in the scintillation property in the vertical direction of the crystal ingot, while also further improving the scintillation property of the single crystal.

In the scintillator single crystal of the invention, preferably Ln is at least one element selected from among Sc and Y and lanthanoid elements with ion radii at least 2 pm smaller than the ion radius of Lm and no greater than 4 pm larger than the ion radius of Lu. This type of scintillator single crystal can further minimize segregation of Lm and further reduce variation in the scintillation properties of the crystal ingot and thus further improve the scintillation properties of the single crystal.

The scintillator single crystal of the invention preferably contains an added element, which is at least one element selected from among elements belonging to Group 2 (Group IIa) of the Periodic Table, at 0.00005-0.1 wt % with respect to the total weight of the single crystal. This type of scintillator single crystal can still further reduce loss or variation in the scintillation properties thought to be due to oxygen defects, and thus improve the scintillation properties of the single crystal while reducing the light output background (afterglow) caused by crystal defects.

The scintillator single crystal of the invention preferably contains an added element which is at least one element selected from among elements belonging to Group 13 of the Periodic Table, at 0.00005-0.1 wt % with respect to the total weight of the single crystal. This type of scintillator single crystal can exhibit a more notable effect of improving the scintillation properties of the single crystal while reducing the light output background (afterglow) caused by crystal defects, and also including an added element which is one or more elements selected from among elements belonging to Group 2 of the Periodic Table can produce an even higher effect.

The scintillator single crystal of the invention preferably contains an added element which is at least one element selected from among elements belonging to Groups 4, 5, 6, 14, 15 and 16 of the Periodic Table, at no greater than 0.002 wt % with respect to the total weight of the single crystal. This type of scintillator single crystal can further inhibit deterioration in the scintillation properties.

The heat treatment method for production of the scintillator single crystal of the invention is a heat treatment method in which a single crystal body is grown using a starting material comprising the constituent element for a scintillator single crystal containing a cerium-activated orthosilicate compound represented by the following general formula (1), after which the single crystal body is heat treated at a temperature of 700-1300° C. in a nitrogen- or inert gas-containing atmosphere with an oxygen concentration of 10-100 vol %.

(Wherein Lm represents at least one element selected from among Sc and Y and lanthanoid elements with lower atomic numbers than Lu, Ln represents at least one element selected from among Sc, Y, B, Al, Ga and In and lanthanoid elements with ion radii intermediate between Lm and Lu, x represents a value of greater than zero and no greater than 0.5, y represents a value of greater than 1 and less than 2, and z represents a value of greater than zero and no greater than 0.1.)

According to this heat treatment method, it is possible to reduce variation in the single crystal (single crystal ingot) due to segregation between the elements, and to alleviate the afterglow property and deterioration in properties that is attributed to oxygen defects, thus providing a single crystal with improved scintillation properties.

The method for production of a scintillator single crystal according to the invention is a scintillator single crystal production method comprising a step of preparing a starting material comprising the constituent element for a scintillator single crystal containing a cerium-activated orthosilicate compound represented by the following general formula (1), and growing a single crystal body by the Czochralski method, and a step of heat treating the single crystal body at a temperature of 700-1300° C. in a nitrogen- or inert gas-containing atmosphere with an oxygen concentration of 10-100 vol %.

(Wherein Lm represents at least one element selected from among Sc and Y and lanthanoid elements with lower atomic numbers than Lu, Ln represents at least one element selected from among Sc, Y, B, Al, Ga and In and lanthanoid elements with ion radii intermediate between Lm and Lu, x represents a value of greater than zero and no greater than 0.5, y represents a value of greater than 1 and less than 2, and z represents a value of greater than zero and no greater than 0.1.)

According to this production method, it is possible to provide a scintillator single crystal production method which reduces cracking and other problems during crystal growth due to segregation between elements, which not only improves the scintillation properties but also alleviates the afterglow property and deterioration in properties that is attributed to oxygen defects, so that high scintillator properties can be realized.

As mentioned above, the scintillator single crystal of the invention ameliorates the problems faced when the host crystal contains Lm, which is at least one element selected from among Sc, Y and lanthanoid elements with lower atomic numbers than Lu, such as abnormal growth of crystals due to generation of crystal defects that occur during crystal growth as a result of segregation of Lm with respect to Lu, and due to reduced light transmittance of the crystal resulting from cell growth and generation of defects, and it is thereby possible to provide a scintillator single crystal with improved scintillation properties.

Moreover, the heat treatment method for production of the scintillator single crystal of the invention, and the method for production of the scintillator single crystal of the invention, can provide a scintillator single crystal having the properties described above, i.e. a scintillator single crystal with less variation in light output or energy resolution that results from differences in the composition within the single crystal due to segregation of Lm, and thus has improved scintillation properties.

DESCRIPTION OF THE PREFERRED EMBODIMENTS

[Scintillator Single Crystal]

The scintillator single crystal of the invention is a scintillator single crystal comprising a cerium-activated orthosilicate compound represented by the following general formula (1).

(Wherein Lm represents at least one element selected from among Sc and Y and lanthanoid elements with lower atomic numbers than Lu, Ln represents at least one element selected from among Sc, Y, B, Al, Ga and In and lanthanoid elements with ion radii intermediate between Lm and Lu, x represents a value of greater than zero and no greater than 0.5, y represents a value of greater than 1 and less than 2, and z represents a value of greater than zero and no greater than 0.1.)

The ion radii are the empirical radii according to Shannon and Prewitt (1969, 70), cited from the web page of the Hiroshima University Earth Resources Research Laboratory (http://home.hiroshima-u.acjp/er/Min_G2.html) (partly from Shannon (1976) and partly the values estimated by Pauling (1960) or Ahrens (1952)).

The atomic numbers and ion radii of the lanthanoid elements are as follows: La (atomic number: 57, ion radius: 116 pm), Ce (58, 114 pm), Pr (59, 113 pm), Nd (60, 111 pm), Pm (61, 109 pm), Sm (62, 108 pm), Eu (63, 107 pm), Gd (64, 105 pm), Tb (65, 104 pm), Dy (66, 103 pm), Ho (67, 102 pm), Er (68, 100 pm), Tm (69, 99 pm), Yb (70, 99 pm), Lu (71, 98 pm). The atomic numbers and ion radii of Sc, Y, B, Al, Ga and In are: Sc (21, 87 pm), Y (39, 102 pm), B (5, 12 pm), Al (13, 53 pm), Ga (31, 62 pm) and In (49, 80 pm). Here, 1 pm=0.01 Å.

In general formula (1) above, Lm is preferably at least one element selected from among La, Gd, Nd, Sm, Eu, Tb, Dy, Ho, Er and Y, more preferably La, Gd and Y and most preferably Gd, from the viewpoint of more easily obtaining a single crystal body as the host crystal.

Ln and other elements may be present at the lattice position of rare earth elements such as the elements Lu or Lm, or at the lattice position of Si, or at an interstitial site, in the host crystal. Elements with ion radii closer to elements in the host crystal (Si: 40 pm, Lu: 98 pm) more readily substitute at lattice positions, and therefore more greatly affect the segregation properties and coloration or scintillation properties of the single crystal.

In general formula (1) above, Ln is preferably at least one element selected from among lanthanoid elements such as Sc, Y, Yb, Tm, Er, Ho, Dy and Tb, because their ion radii are relatively close to that of the element Lu or smaller than that of Lu in the host crystal, and it is more preferably at least one element selected from among B, Al, Ga and In because their ion radii are smaller than Lu and a trivalent state ($Ln^{3+}$) can be stably obtained. These elements are relatively resistant to segregation with respect to the element Lu in the host crystal and therefore produce an effect of inhibiting segregation of Lm in the host crystal. Ln is more preferably at least one element selected from among Sc, Y and Yb since they allow relatively easier single crystal growth even when abundantly present in the crystal, and Y is particularly preferred from the viewpoint of obtaining an effect without impairing the scintillator property or of improving the scintillator property.

When Lm is Gd, Ln is preferably at least one element selected from among Sc, Y, Yb, Tm, Er, Ho, Dy, Tb, B, Al, Ga and In, and more preferably at least one element selected from among Sc, Y and Ga, with Y being especially preferred.

Preferably, Ln is at least one element selected from among Sc and Y and lanthanoid elements with ion radii at least 2 pm smaller than the ion radius of Lm and no greater than 4 pm larger than the ion radius of Lu. For example, when Lm is Gd, Ln is preferably Y.

In general formula (1), x preferably represents a value of greater than zero and no greater than 0.5, more preferably greater than zero and no greater than 0.2 and most preferably greater than zero and no greater than 0.1. Also, y is preferably a value of greater than 1 and less than 2, more preferably a value of greater than 1.6 and less than 2 and even more preferably a value of greater than 1.8 and less than 2. In addition, z is preferably a value of greater than zero and no greater than 0.1, more preferably a value of greater than 0.001 and no greater than 0.02 and even more preferably a value of greater than 0.002 and no greater than 0.005. The expression [2−(x+y+z)] is preferably a value of greater than zero and no greater than 1, more preferably a value of greater than zero and no greater than 0.4 and even more preferably a value of greater than zero and no greater than 0.2.

In general formula (1), x is a value of greater than zero and no greater than 0.2 and a value of smaller than [2−(x+y+z)], y is a value of greater than 1.6 and less than 2, and z is a value of greater than 0.001 and no greater than 0.02. However, when Lm is an element with an ion radius sufficiently greater than Lu, such as La, Ce, Pr, Nd, Pm, Sm, Eu or Gd, x may be greater than zero and no greater than 0.2, and a value equal to or larger than [2−(x+y+z)].

The single crystal of the invention may contain an added element, which is at least one selected from among elements belonging to Group 2 (Group IIa) of the Periodic Table. The ion radii of elements belonging to Group 2 (IIa) of the Periodic Table are, from smallest to largest, Be (35 pm), Mg (72 pm), Ca (112 pm), Sr (125 pm), Ba (142 pm), Ra (148 pm), but Be, Mg, Ca and Sr are preferred because their ion radii are near to or smaller than that of Lu (98 pm), and Mg, Ca are more preferred because their ion radii are closest to that of Lu, with Ca being especially preferred. Including such elements can reduce loss and variation of the scintillation properties believed to be caused by oxygen defects, and can reduce the light output background (afterglow) resulting from crystal defects.

The total content of elements belonging to Group 2 (Group IIa) of the Periodic Table is 0.00005-0.1 wt %, preferably 0.0001-0.05 wt % and more preferably 0.0005-0.01 wt % with respect to the total weight of the single crystal. If the total content is less than 0.00005 wt %, it will be difficult to achieve the effect of adding the element of Group 2 (Group IIa) of the Periodic Table. If the total content is greater than 0.1 wt %, addition of the element of Group 2 (Group IIa) of the Periodic Table will result in increased lattice defects and crystal distortion, more polycrystals and cracking and consequently more difficult crystal growth, while the light output will tend to be reduced as non-luminous levels are formed as a result of lattice defects.

The single crystal of the invention may contain an added element, which is at least one selected from among elements belonging to Group 13 (Group IIIb) of the Periodic Table. The ion radii of elements belonging to Group 13 of the Periodic Table are, from smallest to largest, B (12 pm), Al (53 pm), Ga (62 pm), In (80 pm), Tl (150 pm), but B, Al, Ga and In are preferred because their ion radii are near to not only rare earth elements such as Ce and Lu but also Si (40 pm), or smaller than Si, in the host crystal, and Al and Ga are more preferred, with Al being especially preferred because its ion radius is closest to that of Si. The presence of these elements with the one or more added elements selected from among elements belonging to Group 2 of the Periodic Table will produce a more marked effect of reducing the light output background (afterglow) caused by crystal defects.

The total content of elements belonging to Group 13 (Group IIIb) of the Periodic Table is preferably 0.00005-0.1 wt %, more preferably 0.0001-0.05 wt % and even more preferably 0.0005-0.01 wt % with respect to the total weight of the single crystal. If the total content is less than 0.00005 wt %, it will be difficult to achieve the effect of adding the element of Group 13 of the Periodic Table. If the total content is greater than 0.1 wt %, addition of the element of Group 13 of the Periodic Table will result in increased lattice defects and crystal distortion, more polycrystals and cracking and consequently more difficult crystal growth, while the light output will tend to be reduced as non-luminous levels are formed as a result of lattice defects. The single crystal of the invention may also contain at least one element selected from among elements belonging to Groups 4, 5, 6, 14, 15 and 16 (Groups IVa, Va, VIa, IVb, Vb and VIb) of the Periodic Table. As added elements belonging to Groups 4, 5, 6, 14, 15 and 16 of the Periodic Table there may be mentioned Ti (ion radius: 61 pm), Zr (72 pm) and Hf (71 pm) of Group 4 and Ge (54 pm), Sn (69 pm) and Pb (78 pm) of Group 14 which tend to form tetravalent ions, V (64 pm), Nb (64 pm) and Ta (64 pm) of Group 5 and P (17 pm), As (34 pm) and Sb (61 pm) of Group 15 which tend to form pentavalent ions, and Cr (30 pm), Mo (60 pm) and W (60 pm) of Group 6 and S (12 pm), Se (29 pm) and Te (56 pm) of Group 16 which tend to form hexavalent ions.

The total content of elements belonging to Groups 4, 5, 6, 14, 15 and 16 of the Periodic Table is preferably no greater than 0.002 wt %, more preferably no greater than 0.001 wt %, even more preferably no greater than 0.0005 wt % and most preferably no greater than 0.0002 wt % with respect to the total weight of the single crystal. Since the scintillation properties tend to be poorer in the order of tetravalent→pentavalent→hexavalent, or in order of valency similar to the element in the host crystal, a total content of greater than 0.002 wt % means that the deterioration in scintillation properties will no longer be negligible, especially in the case of elements with relatively large ion radii such as Zr and Hf of Group 4 of the Periodic Table.

In light of the above, the single crystal of the invention preferably contains no Zr or Hf of Group 4 of the Periodic Table among elements belonging to Groups 4, 5, 6, 14, 15 and 16 of the Periodic Table, and more preferably it contains no Zr, Hf, Ti, Ta, V, Nb, W, Mo or Cr which belong to Groups 4, 5 and 6.

[Scintillator Single Crystal Production Method]

The method for production of a scintillator single crystal according to the invention is a scintillator single crystal production method comprising a step of preparing a starting material comprising the constituent element for a scintillator single crystal containing a cerium-activated orthosilicate compound represented by the following general formula (1), and growing a single crystal body by the Czochralski method, and a step of heat treating the single crystal body at a temperature of 700-1300° C. in a nitrogen- or inert gas-containing atmosphere with an oxygen concentration of 10-100 vol %.

$$Lm_{2-(x+y+z)}Ln_xLu_yCe_zSiO_5 \quad (1)$$

(Wherein Lm represents at least one element selected from among Sc and Y and lanthanoid elements with lower atomic numbers than Lu, Ln represents at least one element selected from among Sc, Y, B, Al, Ga and In and lanthanoid elements with ion radii intermediate between Lm and Lu, x represents a value of greater than zero and no greater than 0.5, y represents a value of greater than 1 and less than 2, and z represents a value of greater than zero and no greater than 0.1.)

Growth of the single crystal body may be an ordinary orthosilicate compound single crystal growth method without any particular restrictions, and it may be carried out according to the Czochralski method by RF (Radio Frequency) induction heating using an iridium (Ir) crucible, for example. First, the starting materials as the constituent elements of the compound of general formula (1) are weighed out in stoichiometric ratio, and mixed and loaded into a crucible. The starting material is prepared as oxides (simple oxides or complex oxides) or salts such as carbonates (simple or complex salts), and it may be in the form of a solid powder, for example. If necessary, other elements of Groups 2 or 13 or Groups 4, 5, 6, 14, 15 or 16 of the Periodic Table may be weighed out and added. These elements may be added when the starting material is weighed out or when the starting material is loaded into the crucible, so long as they are in the starting material during crystal growth. The form of their addition is not particularly restricted, and for example, they may be added to the starting material in the form of oxides or carbonates.

The starting material loaded in the crucible is then melted by heating with a RF (Radio Frequency) induction heating furnace, for example, and a seed crystal is loaded into the melt and a cylindrical single crystal body is grown while pulling up the seed crystal. During this time, the heat output from the heating furnace is adjusted in the single crystal body growth step, so that the single crystal body pulled from the melt grows to have a cross-section with the prescribed diameter. The heat output from the heating furnace is then adjusted to cool the grown single crystal body obtained after the crystal growth step, thus forming a single crystal body.

After the crystal growth, it is heat treated (annealing treatment) at a temperature of 700-1300° C. in a nitrogen- or inert gas-containing atmosphere with an oxygen concentration of 10-100 vol %, to obtain a scintillator single crystal according to the invention. The oxygen concentration is preferably at least 20 vol % and most preferably at least 50 vol %. The heat treatment temperature in the nitrogen- or inert gas-containing atmosphere with the oxygen concentration specified above is preferably 700° C.-1300° C., more preferably 1000° C.-1300° C. and most preferably 1100° C.-1300° C. At 700° C. or more, the effect of heat treatment for the allowable treatment time will be sufficient, and at 1300° C. or less it will be possible to prevent deterioration in the scintillation properties due to change in the valency of Ce ($Ce^{3+} \rightarrow Ce^{4+}$). When the single crystal of the invention contains an element of Group 2 (Group IIa) of the Periodic Table, however, an effect of improving the scintillator properties is obtained by heat treatment up to 1500° C., due to an increased effect in which change in the valency of Ce ($Ce^{3+} \rightarrow Ce^{4+}$) is minimized. When the single crystal of the invention does not contain an element of Group 2 (Group IIa) of the Periodic Table, the change in valency of Ce tends to occur more readily, and therefore the heat treatment temperature is preferably 700° C.-1150° C., more preferably 900° C.-1150° C. and even more preferably 1000° C.-1150° C.

An effect will generally be obtained with a heat treatment time of 5-48 hours. A treatment time of less than 5 hours may not produce a sufficient effect, while a treatment time of longer than 48 hours will saturate the effect and is therefore uneconomical, although the effect may be increased with a longer treatment time in cases where the processed sample size is large or the heat treatment temperature is toward the low temperature end.

The heat treatment method described in Japanese Unexamined Patent Publication 2007-1850 by the present inventors, for example, is also effective for the scintillator single crystal of the invention. The timing for the heat treatment method is preferably after processing into the final form for use as a scintillator, and before mirror surface treatment of the surface by chemical etching, mechanical polishing, or the like. A larger sample size will generally tend to lengthen the time required to obtain a sufficient effect of heat treatment. Heat treatment after mirror surface treatment may cloud the mirror treated surface, thus lowering the light transmittance.

EXAMPLES

The present invention will now be explained in greater detail based on examples and comparative examples, with the understanding that these examples are in no way limitative on the invention.

Example 1

A single crystal was grown by the Czochralski method. First, a starting material of $Gd_{2-(x+y)}Y_xLu_yCe_zSiO_5$ (x=0.02, y=1.86, z=0.003) was loaded into an iridium crucible with a diameter of 150 mm, a height of 150 mm and a thickness of 3 mm. The starting material was prepared by combining 747.13 g of gadolinium oxide ($Gd_2O_3$, purity: 99.99 wt %), 13,038.28 g of lutetium oxide ($Lu_2O_3$, purity: 99.99 wt %), 79.56 g of yttrium oxide ($Y_2O_3$, purity: 99.99 wt %), 2,127.43 g of silicon dioxide ($SiO_2$, purity: 99.9999 wt %) and 18.19 g of cerium oxide ($CeO_2$, purity: 99.99 wt %) in approximately the prescribed stoichiometric ratio, and after charging a total of 16,011 g of the mixture and 2.821 g of calcium carbonate ($CaCO_3$, purity: 99.99 wt %) (0.007 wt % as Ca), the mixture was heated with a RF (Radio Frequency) induction heating furnace to approximately the melting point of 2100° C. to obtain a melt. The melting point was measured using an electronic optical pyrometer (Pyrostar Model UR-U by Chino Corp.). The tetravalent, pentavalent and hexavalent elements as impurities in the starting material were all present at less than 1 ppm.

Next, the end of the pulling rod to which the seed crystal was anchored was placed in the melt for crystal growth. It was then lifted at the shoulder at a crystal pulling speed of 1.0 mm/h and a rotation rate of 3-1 min$^{-1}$, and upon reaching a diameter of φ85 mm, parallel section growth was initiated at a pulling speed of 1 mm/h and a rotation rate of 1 min$^{-1}$. After growing the prescribed parallel section by weighted automatic diameter control, the crystal was cut out from the melt and cooled to obtain a single crystal body. The gas continuously flowing in the growth furnace during growth and cooling of the single crystal body was $N_2$ gas at a flow rate of 4-3 L/min and $O_2$ gas at a flow rate of 10-15 mL/min. The oxygen concentration in the furnace was confirmed to be 0.2-0.4 vol % by measurement using a galvanic cell diffusion-type oxygen analyzer (Model OM-25 MS10 by Taiei Electric Co., Ltd.)

The obtained single crystal body had a crystal weight of approximately 11,500 g, a shoulder section length of about 75 mm and a parallel section length of about 235 mm. The appearance of the obtained single crystal body exhibited no void defect-attributable opaqueness inside the crystal up to the lowest point of the parallel section, and the crystal had high surface clarity.

A plurality of 4×6×25 mm$^3$ samples were cut out from the obtained single crystal body, from the top (the section with a solidification ratio of about 8% based on the single crystal weight) and bottom (the section with a solidification ratio of about 70% based on the single crystal weight) of the ingot trunk. Each of the obtained single crystal samples was placed on a Pt plate and loaded into an electric furnace. After heating for approximately 4 hours in air (oxygen concentration: approximately 21 vol %) and holding at 1200° C. for 24 hours, it was cooled for about 10 hours. Next, the sample was subjected to chemical etching using phosphoric acid heated to 300° C. until a mirror surface was formed over the entire surface, to obtain a scintillator single crystal for Example 1.

Arbitrary three samples were taken from among the samples obtained from the top and bottom, PTFE tape as a reflective material was wrapped around five sides of each 4×6×25 mm$^3$ sample, excluding one 4×6 mm side, and the remaining 4×6 mm$^2$ side was fixed to a photomultiplier tube surface with optical grease and the energy spectrum for 662 keV gamma rays from 137Cs was measured. The energy spectrum was measured with an MCA (Quantum MCA4000 by PGT) while applying a voltage of 1.45 kV to the photomultiplier tube and amplifying the signal from the dynode using a preamplifier ("113" by ORTEC) and a waveform shaping amplifier ("570" by ORTEC). The energy spectrum of each sample was measured and the light output and energy resolution of each sample was evaluated. The signal from the anode was measured using a high-speed digital oscilloscope (TDS5052 by Tektronix), and the scintillation decay time and background (afterglow) were evaluated. The background was determined by measuring the output (mV) of the oscilloscope immediately after placing the sample in the measuring black box. The mean values for the three samples are shown in Table 1. The scintillation decay times of the samples measured in this example were 40-43 ns, and there were no obvious difference between the samples.

Example 2

A scintillator single crystal was produced in the same manner as Example 1, except for using a starting material prepared by combining 621.29 g of gadolinium oxide (Gd$_2$O$_3$, purity: 99.99 wt %), 13,077.64 g of lutetium oxide (Lu$_2$O$_3$, purity: 99.99 wt %), 159.59 g of yttrium oxide (Y$_2$O$_3$, purity: 99.99 wt %), 2,133.85 g of silicon dioxide (SiO$_2$, purity: 99.9999 wt %) and 18.25 g of cerium oxide (CeO$_2$, purity: 99.99 wt %) in approximately the stoichiometric composition of Gd$_{2-(x+y)}$Y$_x$Lu$_y$Ce$_z$SiO$_5$ (x=0.04, y=1.86, z=0.003), and charging a total of 16,011 g of the mixture and 2.830 g of calcium carbonate (CaCO$_3$, purity: 99.99 wt %) (0.007 wt % as Ca). The tetravalent, pentavalent and hexavalent elements as impurities in the starting material were all present at less than 1 ppm. The appearance of the obtained single crystal body exhibited no void defect-attributable opaqueness inside the crystal up to the lowest point of the parallel section, and the crystal had high surface clarity (Table 1).

Example 3

A scintillator single crystal was produced in the same manner as Example 1, except for using a starting material prepared by combining 867.26 g of gadolinium oxide (Gd$_2$O$_3$, purity: 99.99 wt %), 13,001.15 g of lutetium oxide (Lu$_2$O$_3$, purity: 99.99 wt %), 2.63 g of gallium oxide (Ga$_2$O$_3$, purity: 99.99 wt %), 2,121.37 g of silicon dioxide (SiO$_2$, purity: 99.9999 wt %) and 18.14 g of cerium oxide (CeO$_2$, purity: 99.99 wt %) in approximately the stoichiometric composition of Gd$_{2-(x+y)}$Ga$_x$Lu$_y$Ce$_z$SiO$_5$ (x=0.0008, y=1.86, z=0.003), and charging a total of 16,011 g of the mixture and 2.813 g of calcium carbonate (CaCO$_3$, purity: 99.99 wt %) (0.007 wt % as Ca). The tetravalent, pentavalent and hexavalent elements as impurities in the starting material were all present at less than 1 ppm. The appearance of the obtained single crystal body exhibited void defect-attributable opaqueness inside the crystal up to the lower 10 mm part of the parallel section, and the clarity of the crystal surface was reduced at that section, but the scintillation properties including light output and energy resolution were of a high level (Table 1).

Example 4

A scintillator single crystal was produced in the same manner as Example 1, except for using a starting material prepared by combining 616.26 g of gadolinium oxide (Gd$_2$O$_3$, purity: 99.99 wt %), 13,079.66 g of lutetium oxide (Lu$_2$O$_3$, purity: 99.99 wt %), 159.62 g of yttrium oxide (Y$_2$O$_3$, purity: 99.99 wt %), 2.65 g of gallium oxide (Ga$_2$O$_3$, purity: 99.99 wt %), 2,134.18 g of silicon dioxide (SiO$_2$, purity: 99.9999 wt %) and 18.25 g of cerium oxide (CeO$_2$, purity: 99.99 wt %), in approximately the stoichiometric composition of Gd$_{2-(x+y)}$Y$_{x-0.0008}$Ga$_{0.0008}$Lu$_y$Ce$_z$SiO$_5$ (x=0.0408, y=1.86, z=0.003), and charging a total of 16,011 g of the mixture and 2.830 g of calcium carbonate (CaCO$_3$, purity: 99.99 wt %) (0.007 wt % as Ca). The tetravalent, pentavalent and hexavalent elements as impurities in the starting material were all present at less than 1 ppm. The appearance of the obtained single crystal body exhibited no void defect-attributable opaqueness inside the crystal up to the lowest point of the parallel section, and the crystal had high surface clarity (Table 1).

Example 5

A scintillator single crystal was produced in the same manner as Example 1, except for using a starting material prepared by combining 494.68 g of gadolinium oxide (Gd$_2$O$_3$, purity: 99.99 wt %), 13,117.24 g of lutetium oxide (Lu$_2$O$_3$, purity: 99.99 wt %), 240.11 g of yttrium oxide (Y$_2$O$_3$, purity: 99.99 wt %), 2,140.32 g of silicon dioxide (SiO$_2$, purity: 99.9999 wt %) and 18.30 g of cerium oxide (CeO$_2$, purity: 99.99 wt %), in approximately the stoichiometric composition of Gd$_{2-(x+y)}$Y$_x$Lu$_y$Ce$_z$SiO$_5$ (x=0.06, y=1.86, z=0.003), and charging a total of 16,011 g of the mixture and 2.838 g of calcium carbonate (CaCO$_3$, purity: 99.99 wt %) (0.007 wt % as Ca). The tetravalent, pentavalent and hexavalent elements as impurities in the starting material were all present at less than 1 ppm. The appearance of the obtained single crystal body exhibited no void defect-attributable opaqueness inside the crystal up to the lowest point of the parallel section, and the crystal had high surface clarity.

Comparative Example 1

A scintillator single crystal was produced in the same manner as Example 1, except for using a starting material prepared by combining 872.22 g of gadolinium oxide ($Gd_2O_3$, purity: 99.99 wt %), 12,999.15 g of lutetium oxide ($Lu_2O_3$, purity: 99.99 wt %), 2,121.05 g of silicon dioxide ($SiO_2$, purity: 99.9999 wt %) and 18.14 g of cerium oxide ($CeO_2$, purity: 99.99 wt %), in approximately the stoichiometric composition of $Gd_{2-(y+z)}Lu_yCe_zSiO_5$ (y=1.86, z=0.003), and charging a total of 16,011 g of the mixture and 2.813 g of calcium carbonate ($CaCO_3$, purity: 99.99 wt %) (0.007 wt % as Ca). The appearance of the obtained single crystal body exhibited void defect-attributable opaqueness inside the crystal up to the lower 40 mm part of the parallel section, and control of the crystal size by automatic diameter control was impeded at that section, creating shape disturbances.

Comparative Example 2

A scintillator single crystal was produced in the same manner as Example 1, except for using a starting material prepared by combining 1,257.15 g of gadolinium oxide ($Gd_2O_3$, purity: 99.99 wt %), 12,609.24 g of lutetium oxide ($Lu_2O_3$, purity: 99.99 wt %), 2,126.01 g of silicon dioxide ($SiO_2$, purity: 99.9999 wt %) and 18.18 g of cerium oxide ($CeO_2$, purity: 99.99 wt %), in approximately the stoichiometric composition of $Gd_{2-(y+z)}Lu_yCe_zSiO_5$ (y=1.80, z=0.003), and charging a total of 16,011 g of the mixture and 2.819 g of calcium carbonate ($CaCO_3$, purity: 99.99 wt %) (0.007 wt % as Ca). The appearance of the obtained single crystal body exhibited void defect-attributable opaqueness inside the crystal up to the lower 20 mm part of the parallel section, and the clarity of the crystal surface was reduced at that section.

Example 6

First, a starting material of $Gd_{2-(x+y)}Y_xLu_yCe_zSiO_5$ (x=0.06, y=1.86, z=0.003) was loaded into an iridium crucible with a diameter of 180 mm, a height of 180 mm and a thickness of 3 mm. The starting material was prepared by combining 881.15 g of gadolinium oxide ($Gd_2O_3$, purity: 99.99 wt %), 23,365.08 g of lutetium oxide ($Lu_2O_3$, purity: 99.99 wt %), 427.70 g of yttrium oxide ($Y_2O_3$, purity: 99.99 wt %), 3,812.44 g of silicon dioxide ($SiO_2$, purity: 99.9999 wt %) and 32.60 g of cerium oxide ($CeO_2$, purity: 99.99 wt %), in approximately the prescribed stoichiometric ratio, and after charging a total of 28,518.97 g of the mixture and 5.056 g of calcium carbonate ($CaCO_3$, purity: 99.99 wt %) (0.007 wt % as Ca), the mixture was heated with a RF (Radio Frequency) induction heating furnace to approximately the melting point of 2100° C. to obtain a melt. The melting point was measured using an electronic optical pyrometer (Pyrostar Model UR-U by Chino Corp.). The tetravalent, pentavalent and hexavalent elements as impurities in the starting material were all present at less than 1 ppm.

After seeding, the crystal was lifted at the shoulder at a crystal pulling speed of 1.0 mm/h and a rotation rate of 1 min$^{-1}$, and upon reaching a diameter of φ105 mm, parallel section growth was initiated at a pulling speed of 0.8 mm/h and a rotation rate of 1 min$^{-1}$. After growing the prescribed parallel section by weighted automatic diameter control, the crystal was separated from the melt and cooled to obtain a single crystal body. The gas continuously flowing in the growth furnace during growth and cooling of the single crystal body was $N_2$ gas at a flow rate of 4-3 L/min and $O_2$ gas at a flow rate of 10-15 mL/min. The oxygen concentration in the furnace was confirmed to be 0.2-0.4 vol % by measurement using a galvanic cell diffusion-type oxygen analyzer (Model OM-25 MS10 by Taiei Electric Co., Ltd.)

The obtained single crystal body had a crystal weight of approximately 20,500 g, a shoulder section length of about 80 mm and a parallel section length of about 335 mm. The appearance of the obtained single crystal body exhibited no void defect-attributable opaqueness inside the crystal up to the lowest point of the parallel section, and the crystal had high surface clarity. A plurality of 4×6×25 mm$^3$ samples were separated from the obtained single crystal body, from the top (the section with a solidification ratio of about 8% based on the single crystal weight) and bottom (the section with a solidification ratio of about 70% based on the single crystal weight) of the ingot trunk. Each of the obtained single crystal samples was placed on a Pt plate and loaded into an electric furnace. After heating for approximately 4 hours in air (oxygen concentration: approximately 21 vol %) and holding at 1200° C. for 24 hours, it was cooled for about 10 hours. Next, the sample was subjected to chemical etching using phosphoric acid heated to 300° C. until a mirror surface was formed over the entire surface, to obtain a scintillator single crystal for Example 6.

Example 7

A scintillator single crystal was produced in the same manner as Example 6, except for using a starting material prepared by combining 651.82 g of gadolinium oxide ($Gd_2O_3$, purity: 99.99 wt %), 23,850.78 g of lutetium oxide ($Lu_2O_3$, purity: 99.99 wt %), 174.02 g of scandium oxide ($Sc_2O_3$, purity: 99.99 wt %), 3,790.80 g of silicon dioxide ($SiO_2$, purity: 99.9999 wt %) and 32.58 g of cerium oxide ($CeO_2$, purity: 99.99 wt %), in approximately the stoichiometric ratio of $Gd_{2-(x+y)}Sc_xLu_yCe_zSiO_5$ (x=0.04, y=1.90, z=0.003), and charging a total of 28,519 g of the mixture and 5.052 g of calcium carbonate ($CaCO_3$, purity: 99.99 wt %) (0.007 wt % as Ca). The tetravalent, pentavalent and hexavalent elements as impurities in the starting material were all present at less than 1 ppm. The appearance of the obtained single crystal body exhibited no void defect-attributable opaqueness inside the crystal up to the lowest point of the parallel section, and the crystal had high surface clarity.

Example 8

A scintillator single crystal was produced in the same manner as Example 6, except for using a starting material prepared by combining 714.92 g of yttrium oxide ($Y_2O_3$, purity: 99.99 wt %), 23,378.99 g of lutetium oxide ($Lu_2O_3$, purity: 99.99 wt %), 450.13 g of scandium oxide ($Sc_2O_3$, purity: 99.99 wt %), 3,922.25 g of silicon dioxide ($SiO_2$, purity: 99.9999 wt %) and 33.71 g of cerium oxide ($CeO_2$, purity: 99.99 wt %), in approximately the stoichiometric composition of $Y_{2-(x+y)}Sc_xLu_yCe_zSiO_5$ (x=0.10, y=1.80, z=0.003), and charging a total of 28,520 g of the mixture and 5.227 g of calcium carbonate ($CaCO_3$, purity: 99.99 wt %) (0.007 wt % as Ca). The tetravalent, pentavalent and hexavalent elements as impurities in the starting material were all present at less than 1 ppm. The appearance of the obtained single crystal body exhibited no void defect-attributable opaqueness inside the crystal up to the lowest point of the parallel section, and the crystal had high surface clarity.

Comparative Example 3

A scintillator single crystal was produced in the same manner as Example 6, except for using a starting material prepared by combining 2,239.30 g of gadolinium oxide ($Gd_2O_3$, purity: 99.99 wt %), 22,460.21 g of lutetium oxide ($Lu_2O_3$, purity: 99.99 wt %), 3,768.11 g of silicon dioxide ($SiO_2$, purity: 99.9999 wt %) and 32.38 g of cerium oxide ($CeO_2$, purity: 99.99 wt %), in approximately the stoichiometric ratio of $Gd_{2-y}Lu_yCe_zSiO_5$ (y=1.80, z=0.003), and charging a total of 28,519 g of the mixture and 5.022 g of calcium carbonate ($CaCO_3$, purity: 99.99 wt %) (0.007 wt % as Ca). The tetravalent, pentavalent and hexavalent elements as impurities in the starting material were all present at less than 1 ppm. With automatic crystal diameter control during parallel section growth of the single crystal body, however, significant fluctuation occurred in the crystal weight increase and heat output, and therefore the crystal growth was interrupted and cooling was carried out.

The obtained single crystal body had a crystal weight of approximately 16,500 g, a shoulder section length of about 80 mm and a parallel section length of about 210 mm. The appearance of the obtained single crystal body exhibited void defect-attributable opaqueness inside the crystal near the center of the parallel section, while the crystal outer diameter increased to about 120 mm with a hollow interior near the lower end of the crystal.

Example 9

A scintillator single crystal was produced in the same manner as Example 1, except for using a starting material prepared by combining 235.09 g of gadolinium oxide ($Gd_2O_3$, purity: 99.99 wt %), 13,600.94 g of lutetium oxide ($Lu_2O_3$, purity: 99.99 wt %), 39.579 g of yttrium oxide ($Y_2O_3$, purity: 99.99 wt %), 2,116.81 g of silicon dioxide ($SiO_2$, purity: 99.9999 wt %) and 18.10 g of cerium oxide ($CeO_2$, purity: 99.99 wt %), in approximately the stoichiometric composition of $Gd_{2-(x+y)}Y_xLu_yCe_zSiO_5$ (x=0.01, y=1.95, z=0.003), and charging a total of 16,011 g of the mixture. The tetravalent, pentavalent and hexavalent elements as impurities in the starting material were all present at less than 1 ppm. The appearance of the obtained single crystal body exhibited no void defect-attributable opaqueness inside the crystal up to the lowest point of the parallel section, and the crystal had high surface clarity.

Example 10

A scintillator single crystal was produced in the same manner as Example 1, except for using a starting material prepared by combining 1,301.51 g of gadolinium oxide ($Gd_2O_3$, purity: 99.99 wt %), 11,748.81 g of lutetium oxide ($Lu_2O_3$, purity: 99.99 wt %), 740.77 g of yttrium oxide ($Y_2O_3$, purity: 99.99 wt %), 2,201.04 g of silicon dioxide ($SiO_2$, purity: 99.9999 wt %) and 18.82 g of cerium oxide ($CeO_2$, purity: 99.99 wt %), in approximately the stoichiometric composition of $Gd_{2-(x+y)}Y_xLu_yCe_zSiO_5$ (x=0.18, y=1.62, z=0.003), and charging a total of 16,011 g of the mixture. The tetravalent, pentavalent and hexavalent elements as impurities in the starting material were all present at less than 1 ppm. The appearance of the obtained single crystal body exhibited void defect-attributable opaqueness inside the crystal up to the lower 40 mm part of the parallel section, and the clarity of the crystal surface was slightly reduced at that section.

Comparative Example 4

A scintillator single crystal was produced in the same manner as Example 1, except for using a starting material prepared by combining 2,422.81 g of gadolinium oxide ($Gd_2O_3$, purity: 99.99 wt %), 11,428.50 g of lutetium oxide ($Lu_2O_3$, purity: 99.99 wt %), 2,141.03 g of silicon dioxide ($SiO_2$, purity: 99.9999 wt %) and 18.31 g of cerium oxide ($CeO_2$, purity: 99.99 wt %), in approximately the stoichiometric ratio of $Gd_{2-(y+z)}Lu_yCe_zSiO_5$ (y=1.62, z=0.003), and charging a total of 16,011 g of the mixture. The appearance of the obtained single crystal body exhibited void defect-attributable opaqueness that was gradually apparent inside the crystal near the center of the parallel section, while a notable degree of void defect-attributable opaqueness inside the crystal and reduction in clarity on the crystal surface was observed toward the lower end of the parallel section. Control of the crystal diameter by automatic diameter control was reduced at the lower end of the parallel section, creating shape disturbances.

Table 1 shows the experimental conditions and growth results for Examples 1-5 and Comparative Examples 1-2, and the results of evaluating their scintillation properties. Table 2 shows the experimental conditions and growth results for Examples 6-8 and Comparative Example 3. Table 3 shows the experimental conditions and growth results for Examples 9 and 10 and Comparative Example 4. These examples are merely preferred modes and are not intended to restrict the scope of the invention.

TABLE 1

| No. | Composition | | | | | | Added element concentration (wt %) | Crystal lower end appearance | Sample No.* | Light output (ch) | Energy resolution | Background (Afterglow) (mV) |
|---|---|---|---|---|---|---|---|---|---|---|---|---|
| | Lm | Ln | Lm Ln 2-x-y-z | Ln x | Lu y | Ce z | | | | | | |
| Example 1 | Gd | Y | 0.117 | 0.02 | 1.86 | 0.003 | Ca 0.007 | Transparent | 1 | 1578 | 8.18 | 4 |
| | | | | | | | | | 2 | 1488 | 7.92 | 3 |
| Example 2 | Gd | Y | 0.097 | 0.04 | 1.86 | 0.003 | Ca 0.007 | Transparent | 1 | 1593 | 8.13 | 2 |
| | | | | | | | | | 2 | 1487 | 7.74 | 3 |
| Example 3 | Gd | Ga | 0.1362 | 0.0008 | 1.86 | 0.003 | Ca 0.007 | Opaque at 10 mm lower end | 1 | 1450 | 8.4 | 0.4 |
| | | | | | | | | | 2 | 1320 | 8.87 | 0.4 |
| Example 4 | Gd | Y Ga | 0.0962 | 0.04 + 0.0008 | 1.86 | 0.003 | Ca 0.007 | Transparent | 1 | 1505 | 8.21 | 0.4 |
| | | | | | | | | | 2 | 1390 | 7.99 | 0.4 |
| Example 5 | Gd | Y | 0.077 | 0.06 | 1.86 | 0.003 | Ca 0.007 | Transparent | 1 | 1588 | 8.1 | 3 |
| | | | | | | | | | 2 | 1499 | 7.72 | 2 |
| Comparative Example 1 | Gd | — | 0.137 | — | 1.86 | 0.003 | Ca 0.007 | Opaque at 20 mm lower end | 1 | 1493 | 8.56 | 5 |
| | | | | | | | | | 2 | 1200 | 9.88 | 5 |

TABLE 1-continued

| | Composition | | | | | Added element | Crystal | | Light | | Background |
|---|---|---|---|---|---|---|---|---|---|---|---|
| No. | Lm | Ln | Lm 2-x-y-z | Ln x | Lu y | Ce z | concentration (wt %) | lower end appearance | Sample No.* | output (ch) | Energy resolution | (Afterglow) (mV) |
| Comparative Example 2 | Gd | — | 0.197 | — | 1.8 | 0.003 | Ca 0.007 | Opaque at 40 mm lower end | 1 | 1384 | 8.39 | 10 |
| | | | | | | | | Poor diameter control | 2 | 806 | 12.3 | 10 |

*1 = Top of ingot, 2 = Bottom of ingot

As seen in Table 1, Gd segregation was inhibited in Examples 1, 2 and 5 since they had compositions containing Y as Ln in the general formula $Lm_{2-(x+y+z)}Ln_xLu_yCe_zSiO_5$ (where Lm is at least one element selected from among Sc, Y and lanthanoid elements with lower atomic numbers than Lu), while the opaqueness at the lower end of the ingot was also eliminated and the scintillation properties including light output and energy resolution were improved, compared to Comparative Example 1 which contained no Y. The scintillation property was especially improved at the bottom part of the ingot, and the vertical difference in properties of the ingot was reduced. In Example 3, the presence of Ga of Group 13 as Ln produced a similar effect, although not as pronounced as in Examples 1 and 2 compared to Comparative Example 1. Addition of Ga also produced an effect of reducing the light output background (afterglow) in Example 3 and Example 4.

The same samples used to evaluate the scintillation properties of Examples 1, 2 and 5 and Comparative Examples 1 and 2 were used for compositional analysis of the top and bottom of the ingot. The analysis was quantitative analysis of the components Lu, Gd, Y and Ce by high-frequency inductively coupled plasma atomic emission spectroscopy (ICP-AES) of the acid or alkali fused sample. As a result, the differences in the Gd component in the tops and bottoms of the ingot (Bottom-Top) were in the order: Comparative Example 2>Comparative Example 1>Example 1>Example 2>Example 5, indicating that Gd segregation was markedly reduced.

In Comparative Examples 1-3, on the other hand, Gd segregation resulted in opaqueness of the crystal at the lower end of the ingot, and in Comparative Example 2 which had a relatively high Gd content, opaqueness was generated earlier during crystal growth, and signs of abnormal growth with poor automatic diameter control were observed. Comparative Example 3 had the same crystal composition as Comparative Example 2, but the timing at which opaqueness was generated inside the crystal tended to be earlier with a larger crucible diameter and crystal size, while abnormal growth of the crystal also readily occurred.

Examples 1-5 and Comparative Examples 1 and 2 contained Ca as a Group 2 element and heat treatment was carried out in air after working of the single crystal sample and therefore, despite difference in properties due to variation in the Lu element concentration from top to bottom of the ingot, relatively stabilized and satisfactory scintillation properties were obtained at the sections where opaqueness of the crystal due to Gd segregation was absent

TABLE 2

| | Composition | | | | | | Added element | |
|---|---|---|---|---|---|---|---|---|
| No. | Lm | Ln | Lm 2-x-y-z | Ln x | Lu y | Ce z | concentration (wt %) | Crystal appearance |
| Example 6 | Gd | Y | 0.077 | 0.06 | 1.86 | 0.003 | Ca 0.007 | Transparent to bottom of crystal |
| Example 7 | Gd | Sc | 0.057 | 0.04 | 1.9 | 0.003 | — | Transparent to bottom of crystal |
| Example 8 | Y | Sc | 0.097 | 0.1 | 1.8 | 0.003 | — | Transparent to bottom of crystal |
| Comparative Example 3 | Gd | — | 0.197 | — | 1.8 | 0.003 | Ca 0.007 | Opaque at 100 mm lower end Abnormal diameter control at 20 mm lower end of crystal |

Table 2 shows the single crystal bodies with relatively large crystal sizes in Examples 6-8 and Comparative Example 3. In Comparative Example 3 which contained no Ln to inhibit Lm segregation, in the general formula $Lm_{2-(x+y+z)}Ln_xLu_yCe_zSiO_5$ (where Lm is at least one element selected from among Sc, Y and lanthanoid elements with lower atomic numbers than Lu), crystal growth problems due to Gd segregation became notable. On the other hand, in Example 6 and 7 which had compositions containing Gd as Lm and Y or Sc as Ln and Example 8 which had a composition containing Y as Lm and Sc as Ln, Lm segregation was inhibited and opaqueness at the lower end of the ingot was eliminated. It is therefore anticipated that scintillator single crystals fabricated using the single crystal bodies of Examples 6-8 will exhibit high scintillation properties.

TABLE 3

| No. | Composition Lm | Composition Ln | Lm 2-x-y-z | Ln x | Lu y | Ce z | Added element concentration (wt %) | Crystal appearance |
|---|---|---|---|---|---|---|---|---|
| Example 9 | Gd | Y | 0.037 | 0.01 | 1.95 | 0.003 | — | Transparent to bottom of crystal |
| Example 10 | Gd | Y | 0.197 | 0.18 | 1.62 | 0.003 | — | Opaque at 40 mm lower end of crystal Gradual opaqueness from approximate center of parallel section Poor diameter control at bottom |
| Comparative Example 4 | Gd | — | 0.377 | — | 1.62 | 0.003 | — | |

Table 3 shows that Example 9 which contained a relatively small amount of Gd as Lm and Y as Ln exhibited no crystal growth problems due to Gd segregation. Of the compositions containing a relatively large amount of Gd as Lm, the crystal growth problems due to Gd segregation became notable in Comparative Example 4 which contained no Ln that inhibits Gd segregation. In Example 10 which contained Y as Ln, on the other hand, Gd segregation was inhibited and the problems at the lower end of the ingot were ameliorated. It is therefore anticipated that scintillator single crystals fabricated using the single crystal bodies of Examples 9 and 10 will exhibit high scintillation properties.

The same samples used to evaluate the scintillation properties of Examples 1, 2 and 5 and Comparative Examples 1 and 2 were used for compositional analysis of the top and bottom of the ingot. The analysis was quantitative analysis of the components Lu, Gd, Y and Ce by high-frequency inductively coupled plasma atomic emission spectroscopy (ICP-AES) of the acid or alkali fused sample. The results are shown in Table 4. Table 4 shows that the differences in the Gd component in the tops and bottoms of the ingot (Bottom-Top) were in the order: Comparative Example 1>Example 1>Example 2, and that Gd segregation was markedly reduced in Examples 1 and 2.

TABLE 5

|  | Lm | Ln |
|---|---|---|
| Example 1, 2, 5, 6, 9, 10 | Gd | Y |
| Example 3 | Gd | Ga |
| Example 4 | Gd | Y, Ga |
| Example 7 | Gd | Sc |
| Example 8 | Y | Sc |
| Combination Example 1 | Gd | Yb |
| Combination Example 2 | Gd | Tm |
| Combination Example 3 | Gd | Er |
| Combination Example 4 | Gd | Ho |
| Combination Example 5 | Gd | Dy |
| Combination Example 6 | Gd | Tb |
| Combination Example 7 | Gd | Al |
| Combination Example 8 | Gd | In |
| Combination Example 9 | La | Y |
| Combination Example 10 | La | Yb |
| Combination Example 11 | La | Sc |
| Combination Example 12 | Y | Yb |
| Combination Example 13 | Y | Tm |

What is claimed is:

1. A scintillator single crystal comprising a cerium-activated orthosilicate compound represented by the following general formula (1):

TABLE 4

| No. | Position | Composition (at %) Lu | Composition (at %) Gd | Composition (at %) Y | Composition (at %) Ce | Top-Bottom difference in ingot composition (at %) Lu | Top-Bottom difference in ingot composition (at %) Gd | Top-Bottom difference in ingot composition (at %) Y | Top-Bottom difference in ingot composition (at %) Ce |
|---|---|---|---|---|---|---|---|---|---|
| Comparative Example 1 | Top | 94.99% | 4.96% | — | 0.05% | 1.84% | 1.79% | — | 0.05% |
|  | Bottom | 93.15% | 6.75% | — | 0.10% | | | | |
| Comparative Example 2 | Top | 92.81% | 7.14% | — | 0.05% | 3.84% | 3.77% | — | 0.07% |
|  | Bottom | 88.97% | 10.91% | — | 0.12% | | | | |
| Example 1 | Top | 94.84% | 4.20% | 0.90% | 0.04% | 1.45% | 1.34% | 0.09% | 0.04% |
|  | Bottom | 93.39% | 5.54% | 0.99% | 0.08% | | | | |
| Example 2 | Top | 94.55% | 3.60% | 1.81% | 0.04% | 0.89% | 0.71% | 0.16% | 0.03% |
|  | Bottom | 93.66% | 4.30% | 1.97% | 0.07% | | | | |
| Example 5 | Top | 94.37% | 2.87% | 2.71% | 0.05% | 0.85% | 0.61% | 0.21% | 0.03% |
|  | Bottom | 93.52% | 3.48% | 2.92% | 0.08% | | | | |

Table 5 shows examples other than Examples 1-10, as representative applicable combinations of Lm and Ln in the general formula $Lm_{2-(x+y+z)}Ln_xLu_yCe_zSiO_5$ (where Lm is at least one element selected from among Sc, Y and lanthanoid elements with lower atomic numbers than Lu) that exhibit notable effects according to the invention.

$$Gd_{2-(x+y+z)}Ln_xLu_yCe_zSiO_5 \quad (1),$$

wherein Ln represents at least one element selected from the group consisting of Sc, Y, B, Al, Ga and In and lanthanoid elements other than Gd and Lu with ion radii intermediate between Gd and Lu, x represents a value of greater than 0.02 and no greater than 0.1, y represents a value of greater than 1.6 and less than 2, and z represents a value of greater than zero and no greater than 0.1, wherein $[2-(x+y+z)]$ is a value greater than zero and no greater than 0.38.

2. A scintillator single crystal according to claim 1, wherein Ln is Y.

3. A scintillator single crystal according to claim 2, wherein x is smaller than $[2-(x+y+z)]$, and z is a value greater than 0.001 and no greater than 0.02.

4. A scintillator single crystal according to claim 1, wherein Ln is at least one element selected from the group consisting of Sc and Y and lanthanoid elements with ion radii at least 2 μm smaller than the ion radius of Gd and no greater than 4 μm larger than the ion radius of Lu.

5. A scintillator single crystal according to claim 1, which contains an added element which is at least one element selected from the group consisting of elements belonging to Group 2 of the Periodic Table, at 0.00005-0.1 wt % with respect to the total weight of the single crystal.

6. A scintillator single crystal according to claim 1, which contains an added element which is at least one element selected from the group consisting of elements belonging to Group 13 of the Periodic Table, at 0.00005-0.1 wt % with respect to the total weight of the single crystal.

7. A scintillator single crystal according to claim 1, which contains an added element which is at least one element selected from the group consisting of elements belonging to Groups 4, 5, 6, 14, 15 and 16 of the Periodic Table, at no greater than 0.002 wt % with respect to the total weight of the single crystal.

8. A scintillator single crystal according to claim 1, wherein $[2-(x+y+z)]$ is not greater than 0.2.

9. A scintillator single crystal according to claim 1, wherein y is greater than 1.8.

* * * * *